United States Patent [19]

Shimizu

[11] Patent Number: 5,150,828
[45] Date of Patent: Sep. 29, 1992

[54] WIRE BONDING METHOD AND APPARATUS FOR SAME CAPABLE OF PACKAGING SEMICONDUCTOR DEVICE INTO THIN PACKAGE

[75] Inventor: Yasuhiko Shimizu, Yokohama, Japan

[73] Assignee: Kabushiki Kaisha Toshiba, Kawasaki, Japan

[21] Appl. No.: 791,169

[22] Filed: Nov. 13, 1991

[30] Foreign Application Priority Data

Nov. 13, 1990 [JP] Japan .................. 2-306451

[51] Int. Cl.⁵ ........................... H01L 21/90
[52] U.S. Cl. .................... 228/102; 228/4.5; 228/8; 228/103; 228/179
[58] Field of Search ............. 228/4.5, 179, 9, 8, 228/102, 103

[56] References Cited

U.S. PATENT DOCUMENTS

| | | | |
|---|---|---|---|
| 4,327,860 | 5/1982 | Kirshenboin et al. | 228/179 |
| 4,418,858 | 12/1983 | Maller | 228/179 X |
| 4,445,633 | 5/1984 | Bonham, Jr. | 228/179 X |

*Primary Examiner*—Kenneth J. Ramsey
*Attorney, Agent, or Firm*—Foley & Lardner

[57] ABSTRACT

A wire bonding method includes a step of calculating the tracking parameters which determine the motion track of a capillary, from a function that has its variables a tracking wire loop length equivalent to the distance between the bonding point on the lead frame and the bonding point on a chip electrode, and amounts that the chips protrude from the positions of the bonding points on the chip electrode to the side of a lead frame electrode, and a step of performing drive control of the capillary in accordance with those calculated values. A wire bonding apparatus used in the method comprises a function generation portion which generates a tracking parameter function, a variable data generation portion in which each bonding object position generates numerical value data for the amount of protrusion and the length, a tracking parameter calculation portion which determines a tracking parameter and outputs numerical value data, and a drive control portion for performing drive control of the capillary according to the numeric value data.

9 Claims, 5 Drawing Sheets

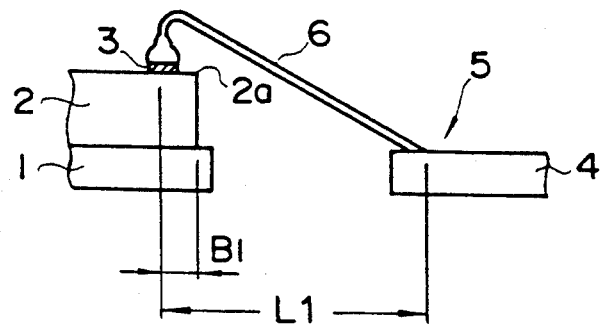
FIG. IA
PRIOR ART
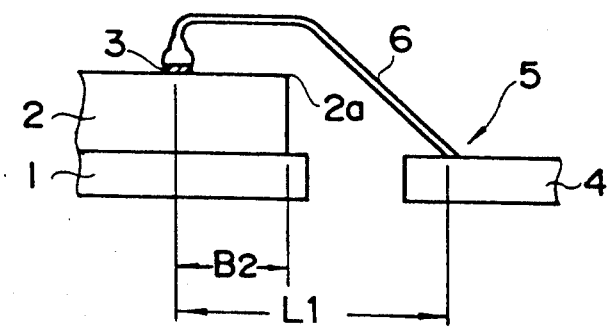
FIG. IB
PRIOR ART

STANDARD TRACKING PARAMETER TABLE

| B/L | REVERSE MOTION AMOUNT | REVERSE HEIGHT | Z RISE AMOUNT | Z DROP TRACK |
|-----|----------------------|----------------|---------------|--------------|
| 0.1 | R1(L,H) | Rh1(L,H) | Sh1(L,H) | f1(L,H,T) |
| 0.2 | R2(L,H) | Rh2(L,H) | Sh2(L,H) | f2(L,H,T) |
| ---- | ---- | ---- | ---- | ---- |

FIG. 3

STANDAD TRACKING PARAMETER FUNCTION

| REVERSE MOTION AMOUNT | REVERSE HEIGHT | Z RISE AMOUNT | Z DROP TRACK |
|-----------------------|----------------|---------------|--------------|
| R(B,L,H) | Rh(B,L,H) | Sh(B,L,H) | f(B,L,H,t) |

FIG. 5

WIRE BONDING METHOD AND APPARATUS FOR SAME CAPABLE OF PACKAGING SEMICONDUCTOR DEVICE INTO THIN PACKAGE

BACKGROUND OF THE INVENTION

The present invention relates to a wire bonding apparatus and a method for the same, and more particularly, to a wire bonding method and apparatus that enables mounting of a chip to a thin package even in cases when an electrode of a chip that includes a semiconductor device is separated from the edge of the chip and is positioned on the inside.

In wire bonding apparatus, it is generally required to change the shape of the loop of the wire in accordance with the electrodes on the chip.

FIGS. 1A and 1B show differences in the shape of the wire loop for the two different cases where a value B there distance from the bonding point of a chip electrode 3 to the end surface of a chip 2 is B1<B2 when loop lengths L1 are both the same. Moreover, in the figure, numeral 1 is an island of a lead frame, 4 is an inner lead of the lead frame, 5 is a lead frame electrode on the inner lead 4, and 6 is a bonding wire.

Many chip electrodes are formed along the edge of the chip. Even if this electrode 5 are positioned in the middle portion of the chip, if it is possible for wire bonding to still be performed, then there will be for loss restrictions when there is the design of the semiconductor device formed in the chip. Then, the wires can be made slightly longer and connection made between the chip electrode 3 and the frame electrode 5. This is one requirement of recent design.

However, in addition to this requirement, there is also the requirement to have thinner semiconductor packages for mounting to chips. In a semiconductor device that has the chip electrode 3 formed in the middle of the chip, the wires that are slightly longer and loop-shaped have a height of about 200-259 μm from the surface of the chip. The thickness of the package that has this chip and lead frame encapsulated by resin must be held to within 1mm overall because of the requirement for thinness. Because of this, the thickness of the resin from the surface of the chip to the outer surface of the package must be held down to 300 μm or less but the state of the bending of the loop formed by the wire, and scattering in the resin when there is encapsulation results in the possibility that the loop may protrude from the surface of the package in some cases.

Namely, as shown in FIG. 1B, when the shape of the loop wire shown in FIG. 1A is applied, then as shown in FIG. 1A for the case of FIG. 1B, a chip corner portion 2a protrudes inside the bonding cavity between the chip electrode 3 and the lead frame electrode 5 and so this wire 6 therefore either comes to the vicinity of or comes into contact with the chip corner portion 2a, and the danger of shorting increases.

Because of this, for the case shown in FIG. 1B, the wire 6 is extended horizontally upwards from the chip electrode 3 and towards the chip corner portion 2a to form a straight portion so that the distance between the chip corner portion 2a the wire 6 is maintained, and the extended end of this straight portion is bent downwards to extend to the frame electrode 5.

Of course, when there is surplus in the upwards direction of the chip 2, the horizontal portion described above is bent, so there is a smooth curve instead of the straight portion described above.

In this manner, by changing the shape of the wire in accordance with the position of the electrode on the chip, it is possible to prevent shorting between the chip 2 and the wire 6.

The following is a description of the process of connecting the wire to the frame electrode and the chip electrode while changing the shape of the loop. The wire is a gold (Au) wire, and is passed by a jig called a capillary that tightens the wire according to necessity by using air inside its hollow tube-shaped cavity to pull the wire tight. The wire protrude slightly from the distal end of the capillary and when a high voltage is applied, the end of the wire melts to form a spherical shape. After this, the wire is pulled into the capillary by air suction and the spherical portion of the wire is positioned at the distal end. A chip electrode is formed from aluminum (Al) beforehand at a required position on the chip 2, and the chip that is placed on the lead frame is heat along with the frame to a temperature of about 250° C. The spherical distal end of the wire is then pressed against the aluminum electrode of the heater chip and the electrode and the wire are joined and when ultrasonic waves are applied to this joined portion, the aluminum and gold at this portion crystallize to form the chip electrode. After this, the tension in the wire is temporarily cancelled and the capillary is raised at a constant amount, the wire is fed out, and the capillary moves by a constant amount in the direction opposite that of the lead frame. This constant amount of movement is termed "reverse displacement". Moreover, the constant amount that the capillary is raised is termed the "reverse height". After movement through the reverse height and the reverse displacement, the air is once again removed from the capillary, tension is again applied to the wire, and an angle (of 90° to 180°) if formed in the wire. After this, the capillary rises by an amount equivalent to the distance to the lead frame electrode, while feeding out the wire once again from the capillary. This amount is defined as the Z rise amount. The capillary moves by the amount of the Z-rise amount and then describes an arc as it drops in the direction for the lead frame electrode. The motion of the distal end of the capillary in this drop movement is defined as the Z-drop path. The capillary guides the wire through this Z-rise and Z-drop to the position for the formation of the lead frame electrode, and presses the wire against the surface of the lead frame. At this time, the frame is heated and to a certain temperature and so the wire is clamped over the capillary and tensioned so that the wire breaks from the portion that is connected to the frame. This is the end of the process of connecting a wire from one chip electrode to one lead frame electrode. After this, the wire bonding processes is repeated for the connection of as many electrodes as necessary.

However, it is possible to change the shape of the wire by changing the tracking parameters (reverse movement amount, reverse height, Z movement amount and Z drop track) that determine the motion track of the capillary of the bonding apparatus.

However, it is necessary to use a computer aided design (CAD) system to change these tracking parameters, and this work becomes complex since it is necessary to confirm the shape of the loop when each of the parameters are actually set. Therefore, the work efficiency for a single chip drops in accordance with the number of the values B. In particular, when a straight portion such as that described above is provided for the shape of the wire, much labor is necessary for the selection of the combination of the tracking parameters.

In the conventional wire bonding method as described above, the setting of the tracking parameters involves much work and so when a single chip has many different distances between the electrode and the chip end surface, that is, when the chips protrude by different amounts from the bonding position on the chip electrode, there is the problem that there is a drop in the work efficiency.

SUMMARY OF THE INVENTION

In the light of these problems associated with the conventional apparatus and method, an object of the present invention is to provide a wire bonding method that does not require the complex work for the setting of the tracking parameters and that can produce a suitable shape for a wire loop so that shorting between the wire and the chip does not occur, and an apparatus for the implementation of this method.

The wire bonding method of the present invention is characterized in calculating the tracking parameters that determine the motion track of the capillary, from a function that has as its variables the tracking wire loop length equivalent to the distance between the bonding point on the lead frame and the bonding point on the chip electrode, and the amounts that the chips protrude from the positions of the bonding points on the chip electrode to the side of the lead frame electrode, and in performing drive control of the capillary in accordance with those calculated values.

In addition, the wire bonding apparatus of the present invention is provided with a function generation portion that generates a tracking function that defines a tracking parameter of a capillary, a variable data generation portion that for each bonding object position generates a parameter generates numerical value data for the amount of protrusion and the length, a tracking parameter calculation portion that determines a tracking parameter through substitution of numeric value data from the variable data generation portion into the tracking parameter function and outputs that numeric value data, and a drive control portion that performs drive control of the capillary in accordance with the numeric value data from the tracking parameters calculation portion.

According to the present invention, the tracking parameters are defined as a function that has as its variables the tracking wire loop length, and the amounts that the chips protrude from the positions of the bonding points on the chip electrode to the side of the lead frame electrode and numerical values for those variables are substituted into the tracking parameter function for each object of bonding to obtain the tracking parameters and so it is possible to automatically define the tracking parameters in accordance with the status for the chip at the space where there wire is to be bonded, and it is possible to obtain an optimum loop shape for a wire and without causing shorting between the wire and the chip, and furthermore, without the complex work that accompanies the setting of the tracking parameters.

According to the present invention, the tracking parameters are defined as a function that has as its variables the tracking wire loop length, and the amounts that the chips protrude from the positions of the bonding points on the chip electrode to the side of the lead frame electrode and numerical values for those variables are substituted into the tracking parameter function for each object of bonding to obtain the tracking parameters and so it is possible to automatically define the tracking parameters in accordance with the status for the chip at the space where there wire is to be bonded, and it is possible to obtain an optimum loop shape for a wire and without causing shorting between the wire and the chip, and furthermore, without the complex work that accompanies the setting of the tracking parameters.

BRIEF DESCRIPTION OF THE DRAWINGS

In the appended drawings:

FIGS. 1A and 1B are views describing examples of the shape of a loop wire, respectively;

FIG. 3 is a view of the structure of table that stores the tracking parameter function for the wire bonding apparatus of FIG. 2;

FIG. 5 is a view of the structure of table that stores the tracking parameter function for the wire bonding apparatus of FIG. 4;

DETAILED DESCRIPTION OF THE PREFERRED EMBODIMENTS

The following is a detailed description of preferred embodiments of the present invention, with reference to the appended drawings.

Figure 2:
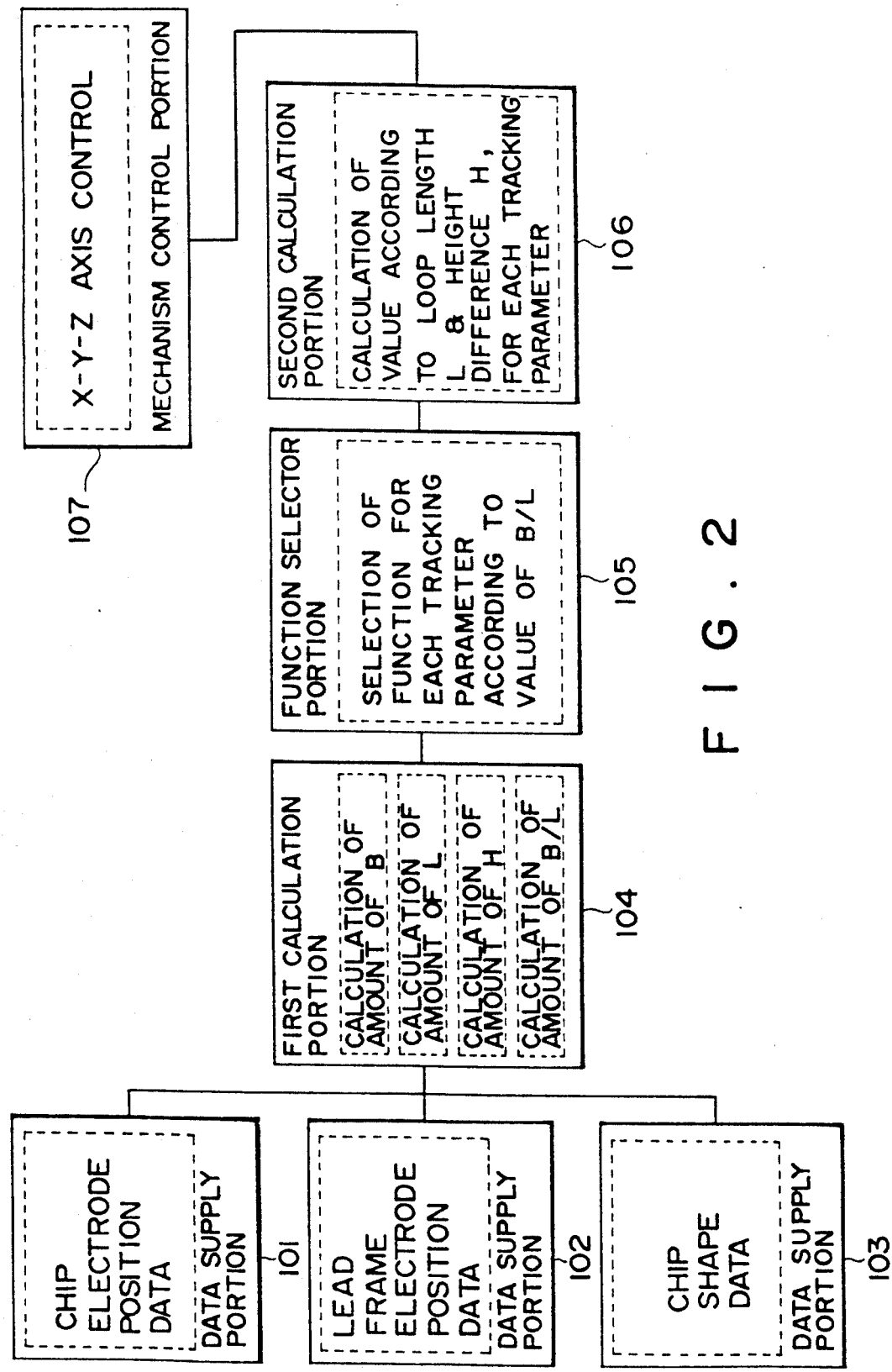
FIG. 2 is a block diagram of a wire bonding apparatus according to a first embodiment of the present invention.

FIG. 2 is a block diagram of a wire bonding apparatus according to a first embodiment of the present invention.

In this figure, the wire bonding apparatus of the first embodiment is provided with data supply portions 101-103, a first calculation portion 104, a function selector portion 105, a second calculation portion 106 and a tri-axis control portion 107.

The data supply portion 101 outputs chip electrode position data that indicates the bonding position on the electrode pad that is formed on the chip, and is configured by coordinates inside the coordinate system of the capillary motion space. The data supply portion does not indicate the position inside the chip.

The data supply portion 102 outputs lead frame electrode position data that indicates the bonding position that becomes the electrode position on the lead frame (inner lead) and therefore in the same manner as the case for the chip electrode position data, is configured by coordinates inside the coordinate system of the capillary motion space.

The data supply portion 103 outputs chip shape data that indicates chip expressed as a space in the capillary motion space coordinate system.

There are the following two statuses for these data supply portions 101-103.

One is the method of obtaining information from other systems, and is for example, the creation of each of the data on the basis of design data for the CAD.

The other is the addition of a self teaching function to the wire bonding apparatus, and therefore this wire bonding function is for example, provided with a camera detection means that records the status in which a lead frame to which the chip is adhered, is set in the wire bonding apparatus, with this image data being used to create the chip electrode position data, the lead frame electrode position data and the chip shape data which are then stored. The chip shape data can be detected by detecting two positions for opposite corners of a chip by camera detection means, means for detecting the height on the chip surface, and a means for detecting the height of the lead frame.

The first calculation portion 104 is a function portion that uses the data from the data supply portions 101-103 to calculate each of the values that become the variable configuring each of the tracking parameter functions that determine the motion track of the capillary, to determine the values B, L, H and B/L shown in FIG. 1.

The amount of B is determined from the chip electrode position data and the chip shape data, and indicates the position that the chip electrode is from the chip corner portion 2a.

The amount of L is determined from the chip electrode position data and the lead frame electrode data, and indicates the distance between both electrodes.

The amount of H is determined from the chip electrode position data and the lead frame electrode position data, and indicates the height difference between the two electrodes.

The value B/L is a parameter that indicates the necessary length of the straight portion of the bonding wire, and the straight portion must be made longer for the larger this value.

The function selector portion 105 refers to the tracking parameter table shown in FIG. 3, using the value for B/L determined by the first calculation portion 104 as the key, and selects the function that is determined for each of the tracking parameters.

Figure 6:
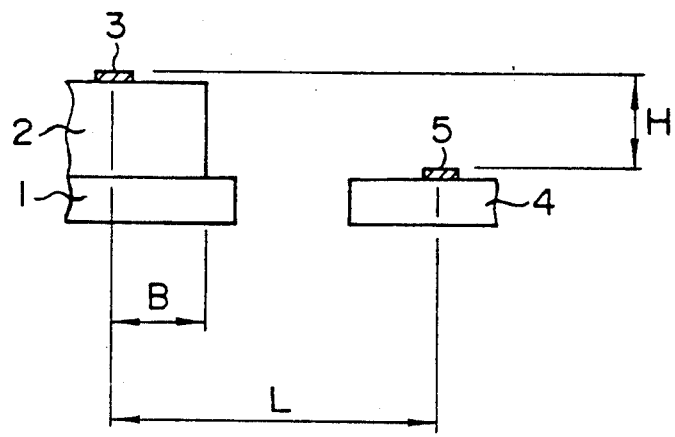
FIG. 6 is a view describing the concept for the variable values of the tracking parameter functions shown in FIG. 3 and FIG. 5.
Figure 7:
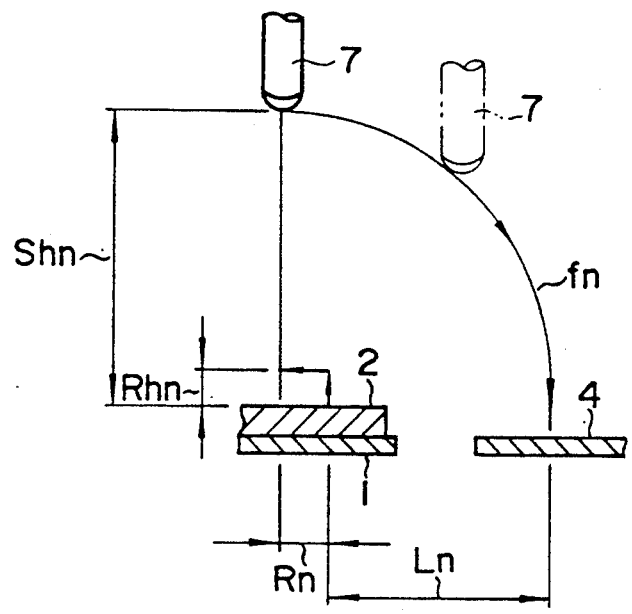
FIG. 7 is a view describing the concept of the tracking parameters.

Here, the reverse height Rhn, the reverse motion amount Rn and the Z rise amount Shn, and the Z drop track fn are also shown in FIG. 7 for the tracking parameters. The capillary moves from the chip electrode to in the direction of the lead frame electrode and performs the bonding. The reverse height Rhn is the amount that the capillary rises with respect to the direction of the Z axis when the capillary moves from the chip electrode position to the reverse start point. The reverse motion amount Rn is the amount that the capillary moves in the horizontal direction away from the reverse start point and towards the Z axis start point. The Z rise amount Shn is the amount of motion in the direction of the Z axis, from the Z axis direction motion start point to the drop start point. The Z drop tracking function fn is a function that determines the motion track when the capillary is moving from the drop start point and in the direction of the lead frame electrode, and is dropping so as to trace a two-dimensional curve. In the table shown in FIG. 6, the necessary length of the straight portion changes with the value of B/L and so the function for parameter calculation described above is stored to correspond to each of the value for B/L. The reverse height Rhn, the reverse motion amount Rn and the Z rise amount Shn are functions that have the value for L and the value for H as the variables and the Z drop track function fn is function that has the values for L and H and the time t as variables. This function table is determined both empirically and theoretically.

In the table shown in FIG. 7, each of the functions are defined in steps of 0.1 of the value of B/L, but when the value of B/L takes a value between 0.1 and 0.2, the function is selected to correspond to the values on both sides.

Returning to FIG. 2, the second calculation portion 106 substitutes the values H and L into each of the parameter functions selected by the function selector portion 105 and determines each of the function values.

In the function selector portion 105, when there is only one selected function corresponding to the value B/L, the value that is obtained by substitution of the values H and L into the function is used as the tracking parameter. Moreover, when there are two selected function corresponding to the value B/L, the value that is obtained by linear interpolation using the values obtained by substitution of the values H and L into each of the functions, is used as the tracking parameter.

In the mechanism control portion 107, the tracking parameter determined in the second calculation portion 106 is used as the basis for drive of the capillary, and looping of the Au wire is performed.

In this manner, according to the present embodiment, the tracking parameters is defined as a function that includes the loop length L of the wire and the protrusion amount B of the chip to the side of the bonding point on the lead frame are used, and the numerical values for these functions are substituted into the tracking parameter function for each of the objects of bonding to obtain the tracking parameters and so it is possible to automatically set the tracking parameters in accordance with the status of the chip corner portion 2a at the space where the wire is to be looped, and it is possible to obtain an optimum loop shape for the wire so that shorting of the wire and the chip 2 does not occur, and without any of the complex work for the setting of the tracking parameters.

Figure 4:
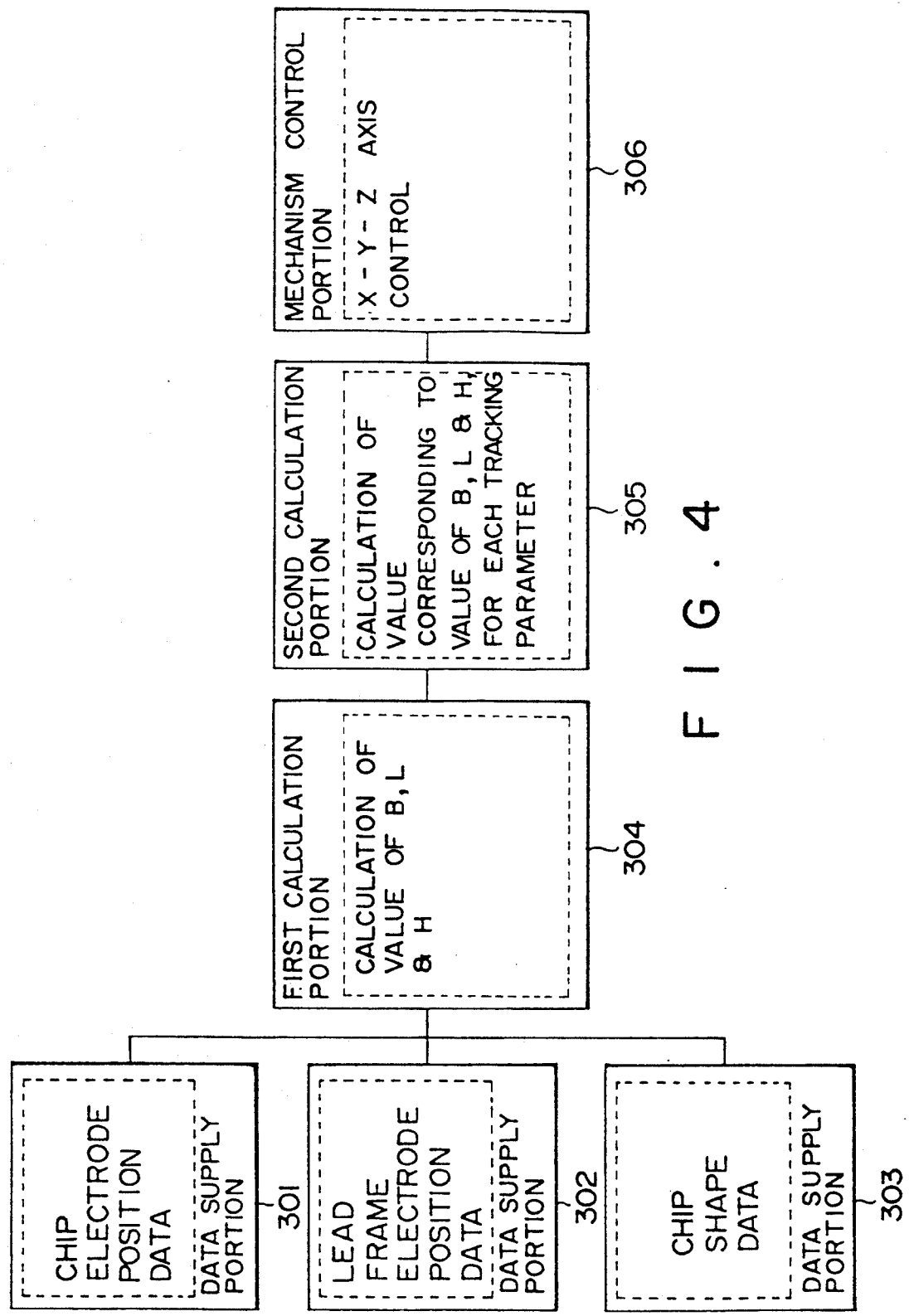
FIG. 4 is a block diagram of a wire bonding apparatus according to a second embodiment of the present invention.

FIG. 4 is a block diagram of a wire bonding apparatus according to a second embodiment of the present invention.

Whereas a straight portion is provided to the bonding wire in addition to the value for B/L when the apparatus of the first embodiment determines the tracking parameter, the apparatus of the second embodiment takes as a premise that there is not going to be a straight portion to the bonding wire and so there are provided the data supply portions 301-303, a first calculation portion 304, a second calculation portion 305 and a mechanism control portion 306.

The data supply portions 301-303 are used in the same manner as the data supply portions 101-103 of the first embodiment.

The first calculation portion 304 has a function that determines the same values as those determined by the first calculation portion 104 of the first embodiment, with the exception of the value B/L.

With respect to each of the tracking parameters, the second calculation portion 305 substitutes the values B, L and H determined by the first calculation portion 304 into the function that is uniquely defined irrespective of the value for B/L and as shown in FIG. 5, and determines the values for each of the functions. Here, the reverse height Rhn, the reverse motion amount Rn and the Z rise amount Shn, and the Z drop track fn are added using the value for B that was not a variable in the first embodiment.

The mechanism control portion 306 performs drive control of the capillary in accordance with the values determined by the second calculation portion 305, and performs the formation of the optimum loop shape.

What is claimed is:

1. A wire bonding method comprising:
    a step of calculating the tracking parameters that determine the motion track of a capillary, from a function that has as its variables a tracking wire loop length equivalent to the distance between the bonding point on the lead frame and the bonding point on a chip electrode, and amounts that the chips protrude from the positions of the bonding points on said chip electrode to the side of a lead frame electrode, and
    a step of performing drive control of said capillary in accordance with those calculated values.

2. The wire bonding method of claim 1, wherein said step for performing said drive control includes:
    a step that on the basis of a function calculated in said calculation step, raises a capillary by a required reverse height while feeding out wire,
    a step that temporarily clamps said wire by negative pressure of a capillary, after said capillary has been moved, on the basis of said function, by a certain reverse movement amount in the direction towards the center of a chip and from an edge of said chip while feeding out said wire,
    a step for raising said capillary, on the basis of said function, by a certain Z-rise amount while feeding out said wire, and
    a step for moving said capillary, on the basis of said function, in a direction the opposite of said reverse displacement and so as to describe an arc.

3. The wire bonding method of claim 2, wherein said Z-rise amount is a distance that can sufficiently obtain a shape for a wire having an obtutely bent portion so that said wire does not contact a corner of a chip, and is a length from said chip electrode to a frame electrode formed afterwards, and includes said reverse height.

4. The wire bonding method of claim 2, wherein a step for performing said drive control includes:
    a step that on the basis of a function calculated in said calculation step, clamps a wire after it has been fed out by said Z-rise amount and presses it to a frame electrode on said lead frame, and then cuts said wire, and performs bonding between a frame electrode and another end of said wire.

5. A wire bonding apparatus comprising
    function generation means for generating a tracking parameter function that defines a tracking parameter of a capillary, and that has as its variables a tracking wire loop length equivalent to the distance between the bonding point on the lead frame and the bonding point on a chip electrode, and amounts that the chips protrude from the positions of the bonding points on said chip electrode to the side of a lead frame electrode,
    variable data generation means that for each bonding object position generates numerical value data for the amount of protrusion and the length,
    tracking parameter calculation means that determines a tracking parameter through substitution of numeric value data from said variable data generation portion into said tracking parameter function and outputs numeric value data, and
    drive control means that performs drive control of said capillary in accordance with said numeric value data from said tracking parameter calculation means.

6. The wire bonding apparatus of claim 5, wherein said tracking parameter calculation means is provided with:
    a first calculation portion that calculates a distance that a chip electrode formed on a chip is from an edge of said chip, a height difference of a lead frame electrode and said chip electrode, and a proportion of the distance that said chip electrode is from the chip edge, with respect to the distance between both said electrodes,
    a function selector portion that selects a function for each of said tracking parameters in accordance with said proportion of the distance that said chip electrode is from the chip edge, with respect to the distance between both said electrodes, and
    a second calculation portion that calculates a value corresponding to said height difference between both electrodes and said distance between both electrodes, for each of said tracking parameters.

7. The wire bonding apparatus of claim 6, wherein said tracking parameter calculation means uses a reference tracking parameter table to calculate a rise height amount that a capillary rises while feeding out wire from said capillary so as to form a bend portion in said wire, a reverse displacement amount when said capillary moves from an edge of a chip towards a middle portion of a chip, a Z-rise amount of a capillary that rises while feeding out said wire, and each of the parameters of the Z drop track that said capillary drops through to the bonding position of a lead frame electrode while forming an arc.

8. The wire bonding apparatus of claim 5, wherein said tracking parameter calculation means is provided with:
    a first calculation portion that calculates a distance that a chip electrode formed on a chip is from an edge of said chip and a height difference of a lead frame electrode and said chip electrode, and
    a second calculation portion that calculates a value corresponding to said three values, for each of said tracking parameters.

9. The wire bonding apparatus of claim 8, wherein said tracking parameter calculation means uses a reference tracking parameter table to calculate a rise height amount that a capillary rises while feeding out wire from said capillary so as to form a bend portion in said wire, a reverse displacement amount when said capillary moves from an edge of a chip towards a middle portion of a chip, a Z rise amount of a capillary that rises while feeding out said wire, and each of the parameters of the Z-drop track that said capillary drops through to the bonding position of a lead frame electrode while forming an arc.

* * * * *